United States Patent [19]

Heston et al.

[11] Patent Number: 4,658,220

[45] Date of Patent: Apr. 14, 1987

[54] DUAL-GATE, FIELD-EFFECT TRANSISTOR LOW NOISE AMPLIFIER

[75] Inventors: David D. Heston, Dallas; Randall E. Lehmann, Garland; David J. Seymour, Plano, all of Tex.

[73] Assignee: Texas Instruments Incorporated, Dallas, Tex.

[21] Appl. No.: 773,266

[22] Filed: Sep. 6, 1985

[51] Int. Cl.⁴ .......................................... H03F 3/193
[52] U.S. Cl. .................................. 330/277; 330/286; 330/307; 330/311
[58] Field of Search .............. 330/286, 277, 307, 311; 357/22, 23, 14

[56] References Cited

PUBLICATIONS

Asai et al., "The Dual-Gate FET with Low Noise and Wide Dynamic Range, IEEE Int. Electron Devices Conf., Digest Tech. Papers (1973), pp. 64–67.
Engberg, "Simultaneous Input Power Match and Noise Optimization Using Feedback," Digests of Technical Papers, Fourth European Microwave Conference, Sep. 1974, pp. 385–389.
Liechti, "Performance of Dual-Gate GaAs MESFET's as Gain Controlled Low-Noise Amplifiers and High-Speed Modulators", IEEE Trans. on Microwave Theory and Techniques, vol. MTT-23, No. 6, Jun. 1975, pp. 461–469.
Nevin et al., "L-Band GaAs FET Amplifier," Microwave Journal, Apr. 1979, pp. 82, 83, 92.
Van der Ziel et al., "Improvement in the Tetrode FET Noise Figure by Neutralization and Tuning," IEEE J. of Solid-State Circuits, Jun. 1969, pp. 170–172.

Primary Examiner—James B. Mullins
Attorney, Agent, or Firm—Richard K. Robinson; Leo N. Heiting; Melvin Sharp

[57] ABSTRACT

A monolithic low noise variable gain amplifier with series feedback includes a dual gate field effect transistor (DGFET) having a common source FET and a common gate FET with scaled gate widths and/or an interelectrode matching element connected to ground through a capacitor positioned between the two gates for reducing the minimum noise figure of the common gate FET and establishing the output load for the common source FET, and an inductive series feedback line for connecting the common source FET to ground. The amount of series feedback between the source and ground of the DGFET as well as the appropriate output load obtained through gate width scaling are selected to make the conjugate input impedance equal to the optimum impedance for a simultaneous noise match and power match.

13 Claims, 9 Drawing Figures

DGFET: PHYSICAL CUTAWAY AND CIRCUIT REPRESENTATION.

DUAL-GATE, FIELD-EFFECT TRANSISTOR LOW NOISE AMPLIFIER

This invention relates to amplifiers and more particularly to a dual gate field effect transistor (DGFET) low noise variable gain amplifier.

BACKGROUND OF THE INVENTION

In the past dual gate field effect transistors (DGFET) have had noise figures greater than their single gate field effect transistor counterparts. Efforts to improve the noise figure (NF) have included the proposal to include an ohmic contact between the two gates with a tuning reactance to ground. Thus, a need exists for a low cost, high performance, reliable low noise amplifier providing low noise signal amplification and low input and output VSWR (voltage standing wave ratio) as well as gain control for the receiver-front end of a phased array radar and which is also a minimum size and weight.

SUMMARY OF THE INVENTION

Accordingly it is an object of this invention to provide an improved dual gate field effect transistor (DGFET) low noise variable gain amplifier.

Another object of the invention is to provide a low noise variable gain amplifier which provides low noise signal amplification and low input and output VSWR.

Yet another object of the invention is to provide a low noise variable gain amplifier which provides gain control for the front end of a radar receiver.

Still another object of the invention is to provide a reliable low noise amplifier which is monolithic, low in cost and weight, small in size and high in performance.

Briefly stated the low noise amplifier constituting the subject matter of this invention comprises dual gate field effect transistors having proper gate width scaling and inductive series feedback for achieving simultaneous noise match and power match. The amount of series feedback between the source and ground of a DGFET and the appropriate output load obtained through gate width scaling are selected such that the conjugate input impedance ($S_{11}^*$) is equal to the optimum input impedance ($Z_{opt}$). The addition of the inductive series feedback decreases the minimum noise figure (minNF) at $Z_{opt}$, and the minimum noise measure remains unchanged. Fabrication of the low noise amplifiers using semiconductor monolithic techniques enables reproduction of the inductive series feedback to provide repeatable inductance values.

BRIEF DESCRIPTION OF THE DRAWINGS

Referring now to FIG. 1a, a monolithic DGFET includes a GaAs substrate 10 having an epitaxially grown n-type layer 12 thereon. Spaced metal dual gates 14 and 16 are formed on the surface of the channel between metal drain and source electrodes 18 and 20. These metal gate electrodes form rectifying Schottky-barrier contacts that deplete the underlying layer of electrons to a depth determined by the voltage applied to them. When the gate voltages go negative, the depleted region widens, thereby constricting the conductive channel and reducing current flow.

Figure 1A:
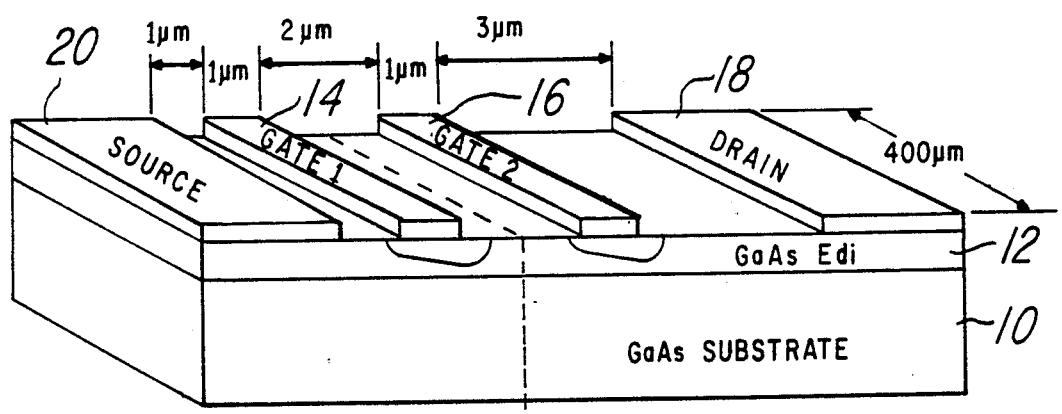
FIGS. 1a and 1b are, respectively, an isometric view of a prior art dual gate field effect transistor, and a schematic representation thereof.
Figure 1B:
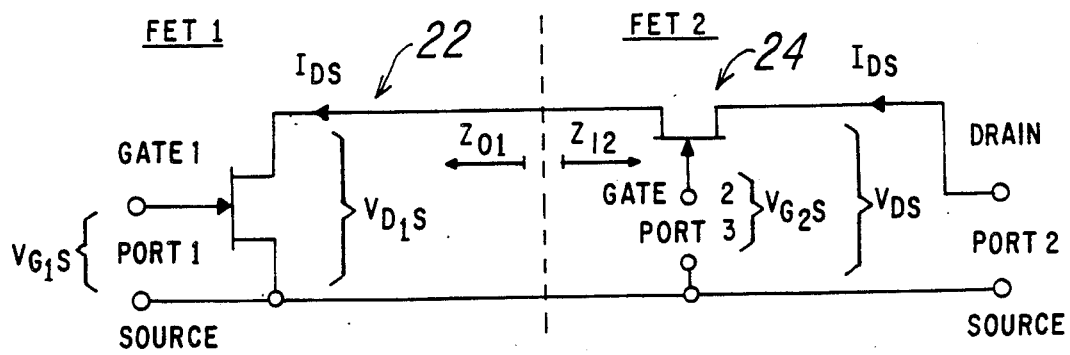

Thus, from a circuit point of view of DGFET can be represented as a common source FET 22 followed immediately by a common gate FET 24 (FIG. 1b). By looking both ways from the dashed line, it will be noted that the input impedance of the common gate stage 24, becomes the load for the common source stage 22. The input impedance ($Z_{in}$) of a common gate FET is approximated as:

$$Z_{in} (1/g_m)$$

The transconductance ($g_m$) and thus the input impedance, as hereinafter demonstrated, can be changed either by changing the bias point (i.e., drain current) or by scaling the gate width. By either of these techniques the input impedance of the common gate can be set to a specific impedance (which is mostly resistive over a wide frequency range). A common gate FET can present an almost constant real load to the common source FET in a dual gate structure. When series feedback is employed between the source and ground of the common source FET, the input impedance ($S_{11}$) of a common source FET can be altered by two external parameters: (1) amount and type of feedback present and (2) the output load. At the same time optimum impedance ($Z_{opt}$) for a common source FET is a function only of the feedback.

Figure 2:
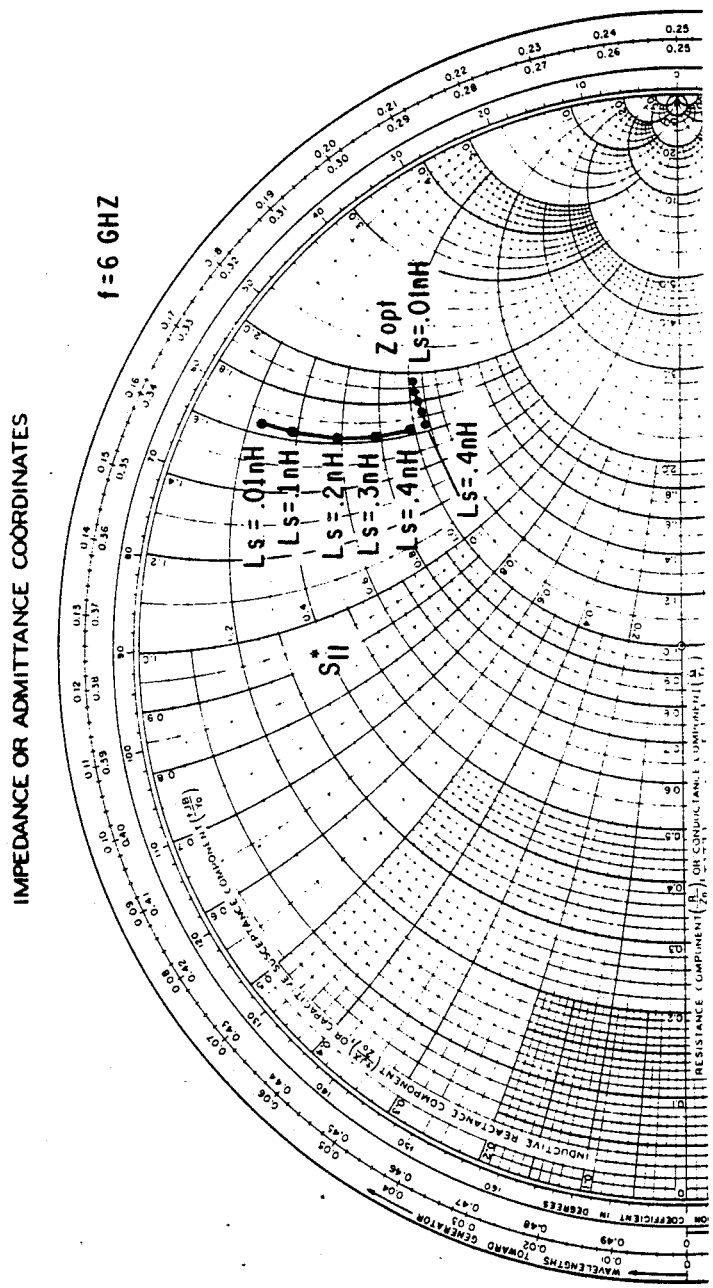
FIG. 2 is a Smith chart of $Z_{opt}$ and $S_{11}^*$ versus Source Inductor for a 300 micron–300 micron DGFET at 6 GHz.
Figure 3:
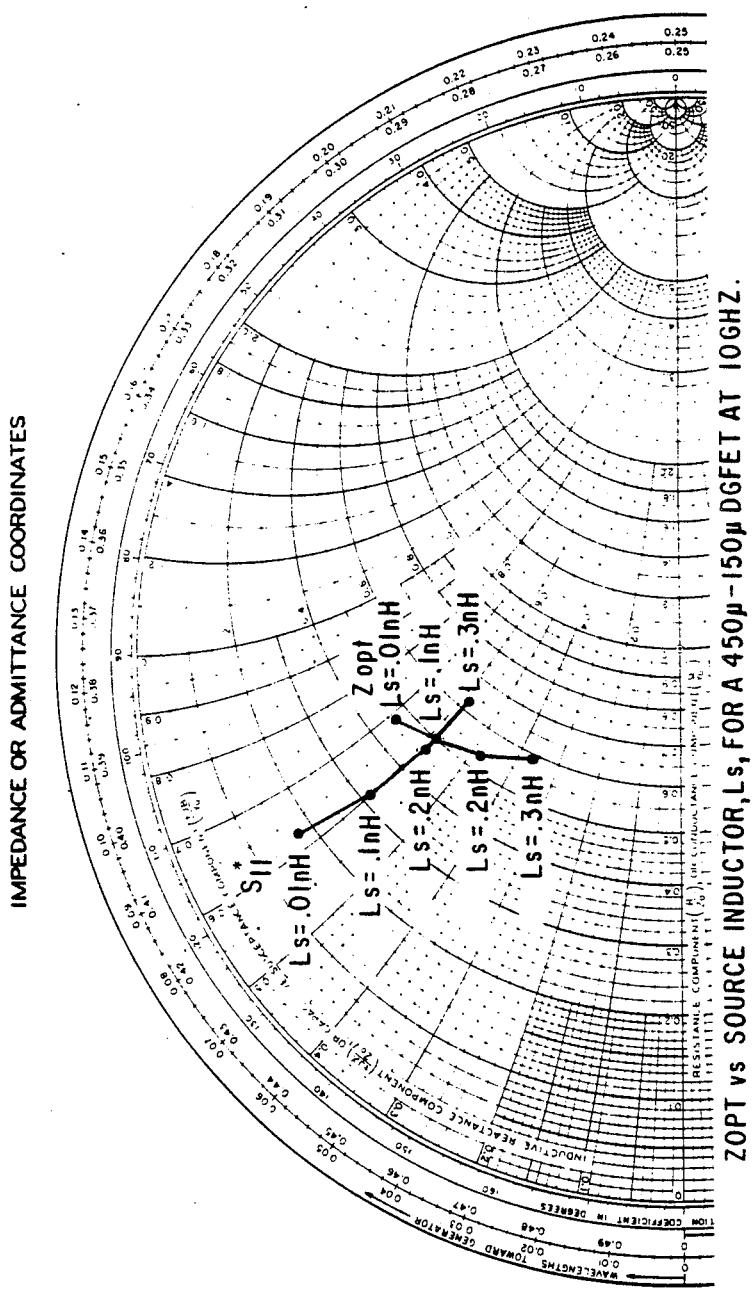
FIG. 3 is a Smith chart of $Z_{opt}$ and $S_{11}^*$ versus Source Inductor for a 450 micron–150 micron DGFET at 10 GHz.

By mapping the change in $Z_{opt}$ and $S_{11}^*$ as the amount of inductive series feedback is varied for a dual gate FET at 6 GHz with gate 1=gate 2=300 microns, a0.4 NH inductor between the source and ground is needed to achieve a simultaneous noise and conjugate match (FIG. 2). Further, by mapping at 10 GHz a second dual gate FET having a 450 micron first gate and a 150 micron second gate a 0.2 nH series feedback inductor on the source results in $S_{11}^*$ moving towards $Z_{opt}$ (FIG. 3).

Thus, achievement of a simultaneous noise and power match in dual gate FETs at a specific frequency band requires a consideration of (1) the amount of inductive series feedback between the source and ground, and (2) scaling of gate 2 relative to gate 1 to obtain proper load impedance for simultaneous noise and gain match at the desired frequency band.

With respect to the effect of inductive seies feedback on noise figure, the feedback element is lossless and adds no noise to the circuit. For a detailed discussion of feedback and its effect on noise figure see J. Engberg, SIMULTANEOUS INPUT POWER MATCH AND NOISE OPTIMIZATION USING FEEDBACK, Digest of Technical Papers, Fourth European Microwave Conference, pp. 385–389, Sept. 1974. Thus the minimum noise measure, Mmin, for a lossless feedback circuit should remain constant, $$Mmin = (Fmin - 1)/(1 - 1/Gav)$$

Figure 5:
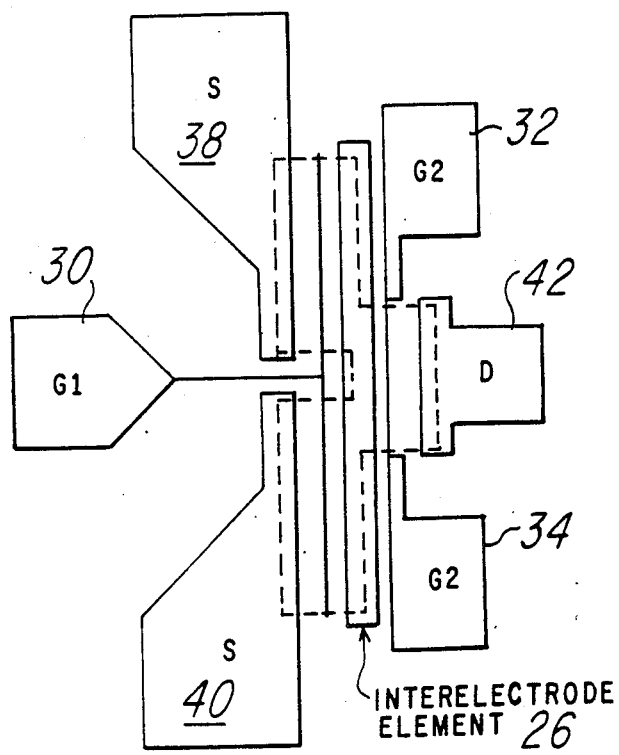
FIG. 5 is a device layout of an interelectrode DGFET.

An example of a device structure for a dual gate FET with an interelectrode ohmic contact and a provision for gate width scaling is shown in FIG. 5. The dotted line (FIG. 5) encloses the active area of the dual gate FET. Gate 1 has a single gate pad 30 connected by a gate feed. Gate 2 is connected by two gate feeds to a balanced set of gate pads 32 and 34 (although it is not necessary to have a balanced configuration). Capacitors 36 (FIG. 6) to ground are placed under each of the pads of gates 32 and 34 for bias considerations of the DGFET. The source is formed with a balanced set of source pads 38 and 40 can also have vias to ground under it. The drain comes to a single drain pad 42. The drain active area is the same size as the second gate, and the source active area is the same size as the first gate. The interelectrode ohmic contact 26 provides the transformation between the two gate sizes by changing the active area on each of its sides to match the appropriate gate width.

Figure 6:
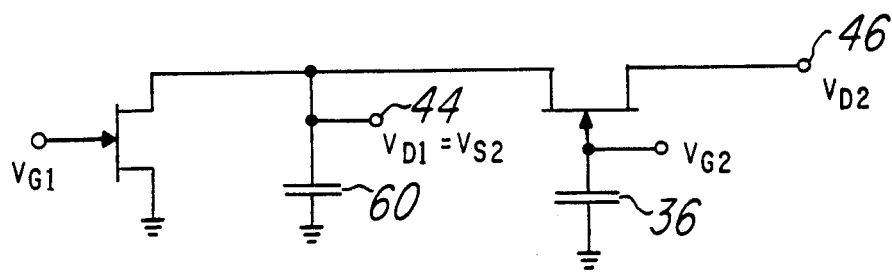
FIG. 6 is a schematic view of a biasing circuit for the interelectrode DGFET of FIG. 5.

A bias circuit for the DGFET with a capacitively terminated interelectrode ohmic contact 26 of FIG. 5. is shown in FIG. 6. The capacitor 60, allows the voltage $V_{D1}$ 44 to be determined by external means. If the $V_{D1}$, 44, is set, for example at 3 volts and $V_{D2}$, 46, is set to 6 volts there will be a 3 volt drain to source potential across each device. The drain to source current for each FET will be determined by its particular value of $V_{GS}$. Thus, where $I_{DS1}$ is not equal to $I_{DS2}$, the excess current $I_{DS1}-I_{DS2}$, will either flow into or out of the interelectrode node. The ability to adjust the bias of the common gate FET separately from the common source FET allows flexibility in setting $g_m$ and thus $S_{11}$ of the common gate device, which provides the load for the common source device.

Figure 4:
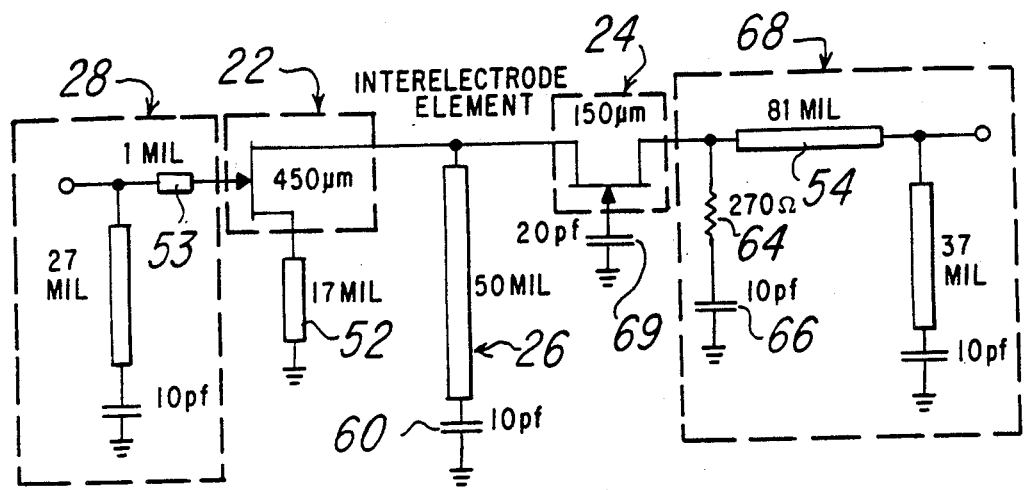
FIG. 4 is a schematic view of a single stage DGFET low noise amplifier with interelectrode matching.

A single stage DGFET amplifier is shown in FIG. 4. An interelectrode matching element 58 is shown as a shunt transmission line connecting the interelectrode ohmic contact 26 and ground through a capacitor. The interelectrode ohmic contact and shunt transmission line is situated between the common source FET 22 and the common gate FET 24. An input matching network 28 provides a match to the simultaneous noise and VSWR impedance. The proper load to obtain a simultaneous noise and gain match is provided by gate width scaling within the DGFET structure. The DGFET output is then free to be matched for good VSWR, through the output matching network 68. In contrast, in a single gate FET the simultaneous noise and gain match is achieved at the expense of output VSWR for a specific amount of series feedback on a single gate FET an input load impedance can be determined which yields $S_{11}*$ equal to $Z_{opt}$. This load is then fixed and the output cannot be matched for good VSWR (it must be accepted for what it is). The DGFET LNA has the advantage then of obtaining a simultaneous noise and conjugate match as well as good output VSWR in a single stage LNA.

A comparison of a DGFET LNA NF and input VSWR with and without interelectrode matching at 9.5 GHz is shown in table 1. It is evident that for the properly designed DGFET LNA a shunt inductor between the two gates, i.e. interelectrode matching element, can vastly improve the NF without significantly degrading the conjugate match condition.

TABLE 1

| LNA STRUCTURE STAGE | INPUT VSWR | LNA NF (dB) | 1st STAGE NF (dB) | 2ND STAGE (COMMON GATE) NF |
|---|---|---|---|---|
| DGFET WITH INTERELECTRODE | 1.25 | 1.92 | 1.74 | 2.18 |
| DGFET WITHOUT | 1.16 | 2.31 | 1.74 | 4.93 |

Figure 7:
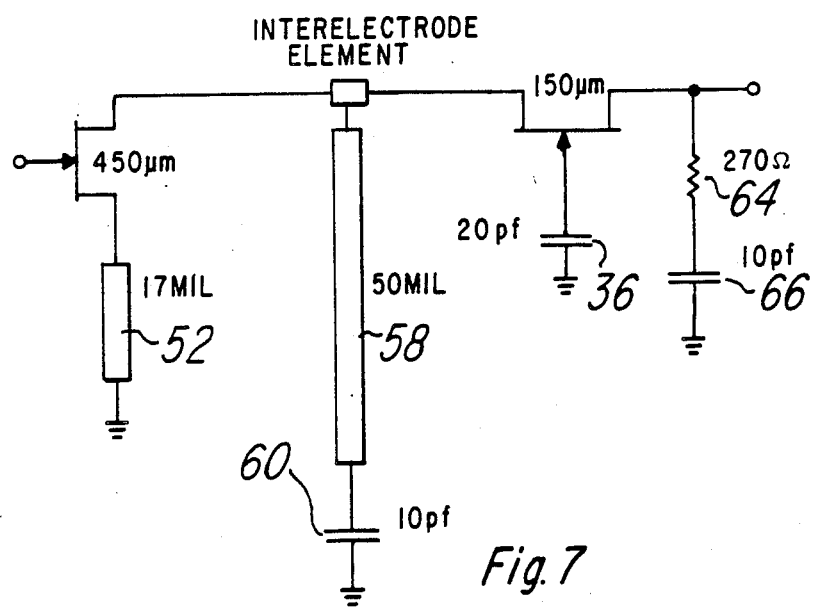
FIG. 7 is a schematic of the interelectrode DGFET of FIG. 8 with interelectrode matching element, feedback inductors and output resistor.
Figure 8:
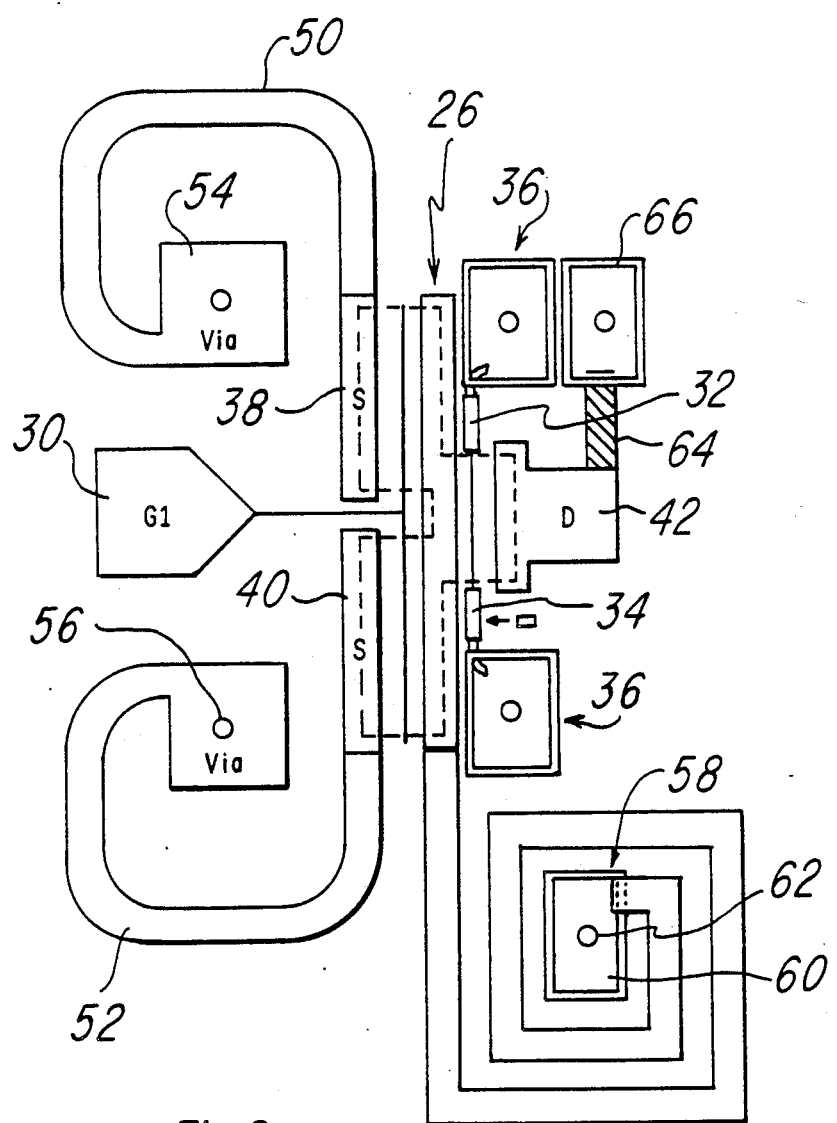
FIG. 8 is a physical layout of the interelectrode DGFET of FIG. 7.

The schematic of the dual gate FET and the interelectrode ohmic contact of the single stage LNA of FIG. 4 is shown in FIG. 7 and a physical layout is shown in FIG. 8. Series feedback transmission lines 50 and 52 connect the source 38 and 40 to ground through vias 54 and 56. The feedback is shown in a balanced configuration; a balanced configuration is not a requirement when the source area of the FET is continuous. An interelectrode matching element 58 connects the interelectrode ohmic contact 26 to a capacitor 60 (FIGS. 7 & 8) and to ground through via 62 (FIG. 8). A shunt resistor 64 (FIGS. 7 & 8) is connected between the drain 42 and a capacitor 66 to ground through a via. Gate pads 32 & 34 of the second gate have capacitors 36 connected to ground under them. It will be noted from a comparison of FIG. 8 to FIG. 5 that a considerable number of elements have been added without significantly increasing the overall chip size. Further, by making the interelectrode matching element a rectangular spiral the amount of chip that is used for the matching element is substantially reduced.

For multistage amplifiers, the DGFET exhibits significant advantages over its single gate FET counterpart. First, there is the increased isolation of the DGFET; secondly, there is an increase in input VSWR bandwidth owing to the constant load impedance over frequency presented by the common gate FET to the Common source FET in a DGFET structure; and finally, there is the gain control feature of DGFETs. In a DGFET such as the above described one, the isolation from drain to gate 1 with the feedback present is 35 dB at 10 GHz. Although the proper load impedance for a simultaneous noise and VSWR match is presented within the DGFET structure itself, i.e., the common gate FET, it is a significant advantage that the interstage network between the first and second DGFET of a multistage DGFET LNA would have little or no effect on the input VSWR match owing to the much improved isolation. The increased isolation is also the reason why a single stage DGFET can be matched for output VSWR without affecting the input match.

Although only a single embodiment of this invention has been described, it will be apparent to a person skilled in the art that various modifications to the details of construction shown described may be made without departing from the scope of this invention.

What is claimed is:

1. A low noise amplifier comprising:
   (a) a dual gate field effect transistor (DGFET) circuit means for achieving simultaneous noise match ($Z_{opt}$) and power match, the dual gate field effect transistor (DGFET) circuit means includes;
   a first device having an input gate for receiving an input signal, a second device connected to the first device and having an output drain for providing a power amplified output signal, an impedance modification means located between the first device and the second device for modifying the load impedance of the second device that is presented to the first device, and feedback means for providing a predetermined series reactance to a source of the first device, the feedback means being connected between the source of the first device and ground.

2. The low noise amplifier according to claim 1 wherein the second device has a gate with a width that provides a predetermined load impedance to the first device when modified by the impedance modification means.

3. The low noise amplifier according to claim 2 wherein the feedback means comprises:

an inductance having a predetermined reactance such that in combination with the predetermined load impedance, the conjugate input impedance ($S_{11}$*) of the dual gate field effect transistor circuit means is approximately equal to the optimum input impedance for minimum noise figure ($Z_{opt}$).

4. The low noise amplifier according to claim 3 wherein the dual gate transistor circuit means is a monolithic device.

5. The low noise amplifier according to claim 1 further comprising:

an input impedance matching network for providing noise and voltage standing wave ratio (VSWR) matching to input signals.

6. The low noise amplifier according to claim 5 wherein the second device has a gate with a width that provides a predetermined load impedance to the first device when modified by the impedance modification means.

7. The low noise amplifier according to claim 6 wherein the feedback means comprises:

an inductance having a predetermined reactance such that in combination with the predetermined load impedance, the conjugate input impedance ($S_{11}$*) of the dual gate field effect transistor circuit means is approximately equal to the optimum input impedance for minimum noise figure ($Z_{opt}$).

8. The low noise amplifier according to claim 7 wherein the dual gate transistor circuit means is a monolithic device.

9. The low noise amplifier according to claim 1 further comprising:

an output impedance matching network for providing voltage standing wave ratio (VSWR) matching to output signals.

10. The low noise amplifier according to claim 9 wherein the second device has a gate with a width that provides a predetermined load impedance when modified by the impedance modification means.

11. The low noise amplifier according to claim 10 wherein the feedback means comprises:

an inductance having a predetermined reactance such that in combination with the predetermined load impedance, the conjugate input impedance ($S_{11}$*) of the dual gate field effect transistor circuit means is approximately equal to the optimum input impedance for minimum noise figure ($Z_{opt}$).

12. The low noise amplifier according to claim 11 further comprising:

an input impedance matching network for providing noise and voltage standing wave ratio (VSWR) to input signals.

13. The low noise amplifier according to claim 12 wherein the dual gate transistor circuit means is a monolithic device.

* * * * *